United States Patent
Chung (10) Patent No.: US 7,943,444 B2
(45) Date of Patent: May 17, 2011

(54) VERTICAL FLOATING BODY CELL OF A SEMICONDUCTOR DEVICE AND METHOD FOR FABRICATING THE SAME

(75) Inventor: Sung Woong Chung, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/705,513

(22) Filed: Feb. 12, 2010

(65) Prior Publication Data
US 2010/0151635 A1 Jun. 17, 2010

Related U.S. Application Data (62) Division of application No. 11/866,950, filed on Oct. 3, 2007, now Pat. No. 7,663,188.

(30) Foreign Application Priority Data

Jul. 27, 2007 (KR) .................. 10-2007-0075590

(51) Int. Cl.
*H01L 21/336* (2006.01)
(52) U.S. Cl. ........ 438/156; 438/137; 438/138; 438/151; 257/347; 257/395
(58) Field of Classification Search .................. 438/156, 438/151, 134, 137, 138; 257/347, 396, E21.41, 257/E21.561
See application file for complete search history.

(56) References Cited

U.S. PATENT DOCUMENTS

| | | | |
|---|---|---|---|
| 5,637,898 A | 6/1997 | Baliga | |
| 6,015,725 A * | 1/2000 | Hirayama | ..................... 438/156 |
| 6,617,651 B2 * | 9/2003 | Ohsawa | ......................... 257/366 |
| 6,667,502 B1 | 12/2003 | Agarwal et al. | |
| 7,244,991 B2 | 7/2007 | Ohsawa | |
| 2006/0113686 A1 | 6/2006 | Minami | |
| 2007/0158719 A1 | 7/2007 | Wang | |

FOREIGN PATENT DOCUMENTS
JP 2006-080549 3/2006
KR 100699890 B1 3/2007

OTHER PUBLICATIONS

Shino, Tomoaki, et al., "Floating Body RAM Technology and its Scalability to 32 nm Node and Beyond", IEEE, (2006).
Hamamoto, Takeshi, et al., "A Floating Body Cell (FBC) fully Compatible with 90 nm CMOS Technology Node for Embedded Applications", IEEE, (2006).
Okhonin, S., et al., "A SOI Capacitor-less 1T-DRAM Concept", 2001 IEEE SOI Conference, Oct. 2001; 153-154.

* cited by examiner

*Primary Examiner* — Thinh T Nguyen
(74) *Attorney, Agent, or Firm* — Kilpatrick Townsend & Stockton LLP

(57) ABSTRACT

A semiconductor device includes a tube-type channel formed over a semiconductor substrate. The tube-type channel is connected to first and second conductive lines. A bias electrode is formed in the tube-type channel. The bias electrode is connected to the semiconductor substrate. An insulating film is disposed between the tube-type channel and the bias electrode. A surrounding gate electrode is formed over the tube-type channel.

17 Claims, 14 Drawing Sheets

VERTICAL FLOATING BODY CELL OF A SEMICONDUCTOR DEVICE AND METHOD FOR FABRICATING THE SAME

CROSS-REFERENCES TO RELATED APPLICATIONS

This application is a divisional of U.S. patent application Ser. No. 11/866,950, filed on Oct. 3, 2007, and claims priority of Korean patent application number 10-2007-0075590, filed on Jul. 27, 2007, both of which are incorporated by reference in their entirety.

BACKGROUND OF THE INVENTION

The invention generally relates to a semiconductor device. More particularly, the invention relates to a vertical floating body cell and a method for fabricating the same.

Efforts have been made to overcome limitations of a cell structure including a transistor and a capacitor. For example, a capacitor that inhibits the high integration of a memory is eliminated, and a memory cell is configured to have a transistor, which is referred to as a floating body cell (FBC) structure. The FBC structure utilizes a floating body effect phenomenon that changes a threshold voltage when charges are accumulated in a channel bottom of the transistor.

When holes are injected or accumulated into a NMOS, a floating body effect is generated to lower the threshold voltage of the channel and increase the current of the transistor. In FBC, a silicon-on-insulator (SOI) substrate is required so that the holes in the bottom of the channel may be retained for a long period of time. The detailed structure and operation of the FBC are explained with reference to "Floating body RAM technology and its scalability to 32 nm node and beyond" (T. Shino et al., IEDM, 2006).

In DRAM a capacitor is connected to a cell transistor, and a complicated process is required to form the structure. Also, a high thermal treatment process is required to improve a characteristic of the transistor. The FBC technology may skip the above-described complicated process so that a device may be highly integrated. The FBC technology facilitates an embodiment of an embedded DRAM including a logic circuit without a capacitor, thereby being useful in various applications.

If a channel length becomes shorter in the FBC having a plane transistor, an area where charges can be accumulated is reduced. Also, generated charges are recombined into source/drain regions so that it is difficult to retain data. As a result, it is difficult to reduce the size of the transistor. The usage of the SOI wafer increases manufacturing costs, thereby limiting commercialization of FBCs.

SUMMARY OF THE INVENTION

Embodiments of the present invention are directed to a semiconductor device including a FBC. According to an embodiment of the invention, the FBC includes a tube-type channel, a bias electrode connected to a semiconductor substrate in the tube-type channel, an insulating film disposed between the tube-type channel and the bias electrode, and a surrounding gate formed over the tube-type channel. The FBC secures a sufficient area where charges are accumulated, thereby improving integration of the device and data retention time of the device.

According to an embodiment of the present invention, a semiconductor device including a floating body cell structure includes a tube-type channel formed over a semiconductor substrate and connected to first and second conductive lines. A bias electrode is formed in the tube-type channel and is connected to the semiconductor substrate. An insulating film is located between the tube-type channel and the bias electrode. A surrounding gate electrode is formed over the tube-type channel.

According to an embodiment of the present invention, a method for fabricating a semiconductor device includes forming a conductive pillar over a semiconductor substrate. A portion of the conductive pillar and the semiconductor substrate is etched to form a conductive tube. An insulating film is formed over an inner sidewall of the conductive tube. A bias electrode connected to the semiconductor substrate is formed to fill the conductive tube. A gate insulating film is formed over an outer surface of the conductive tube. A surrounding gate electrode is formed over the gate insulating film.

DESCRIPTION OF EMBODIMENTS

According to an embodiment of the present invention, a semiconductor device has a FBC structure which includes a vertical transistor.

Figure 1:
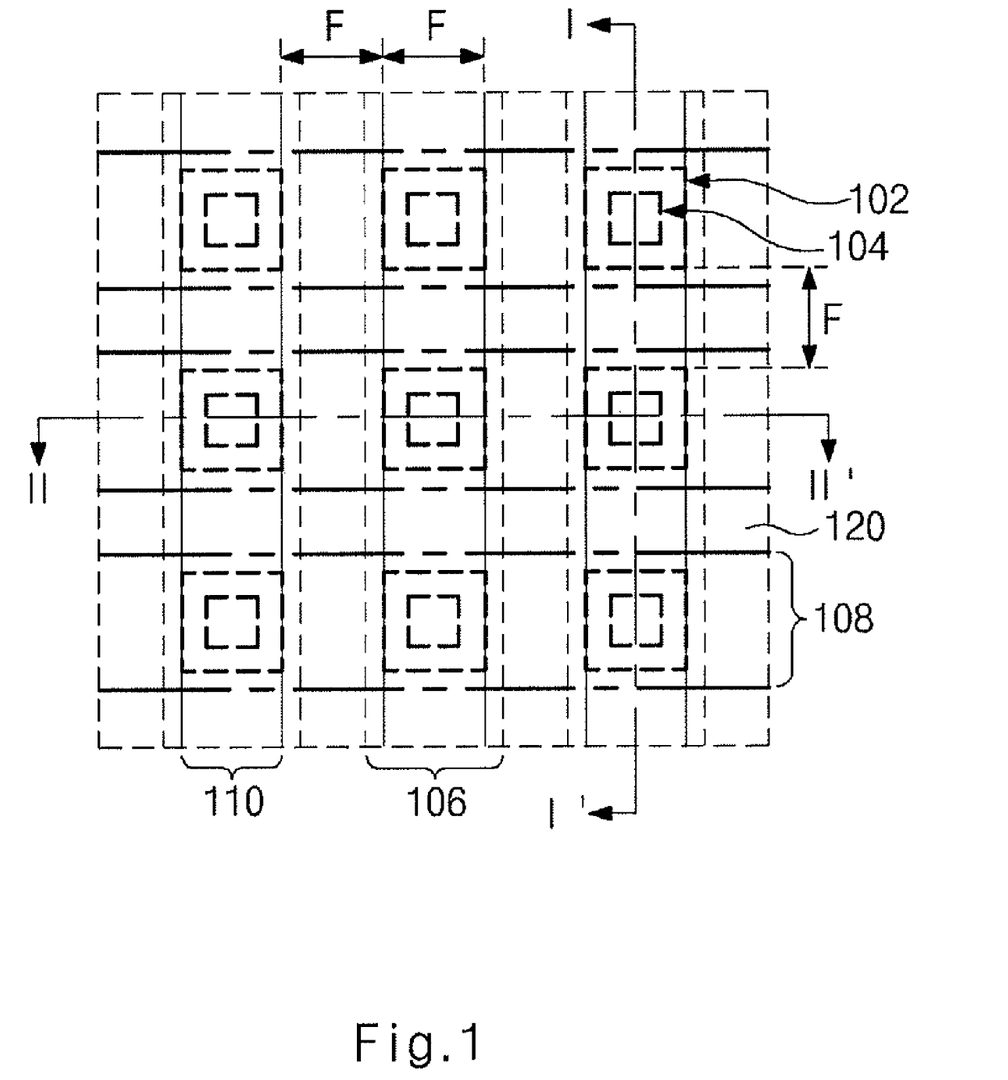
FIG. 1 is a layout of a semiconductor device according to an embodiment of the present invention.

FIG. 1 is a layout of a semiconductor device according to an embodiment of the present invention. A semiconductor device includes a channel region 102 defined by a device isolation region 120, a bias electrode region 104, a source line region 106, a word line region 108, and a bit line region 110. Source line region 106 is extended toward one direction over a semiconductor substrate. Channel region 102 is disposed over source line region 106 to have a vertical tube structure. Bias electrode region 104 is located in channel region 102.

An outer line-width of channel region 102 is F, where F is a distance between two adjacent channel regions 102. Although the top surface of channel region 102 (as shown in FIG. 1) is formed to be rectangular in the embodiment of the present invention, the top surface of channel region 102 may be formed to be circular or polygonal.

Word line region 108 is extended toward one side so that word line region 108 intersects source line region 106, and is formed outside channel region 102, to have a surrounding gate structure. Bit line region 110 is disposed over channel region 102, overlaps with source line region 106, and extends toward one side. A line-width of word line region 108 is larger than that of channel region 102 so as to cover channel region 102.

Figure 2:
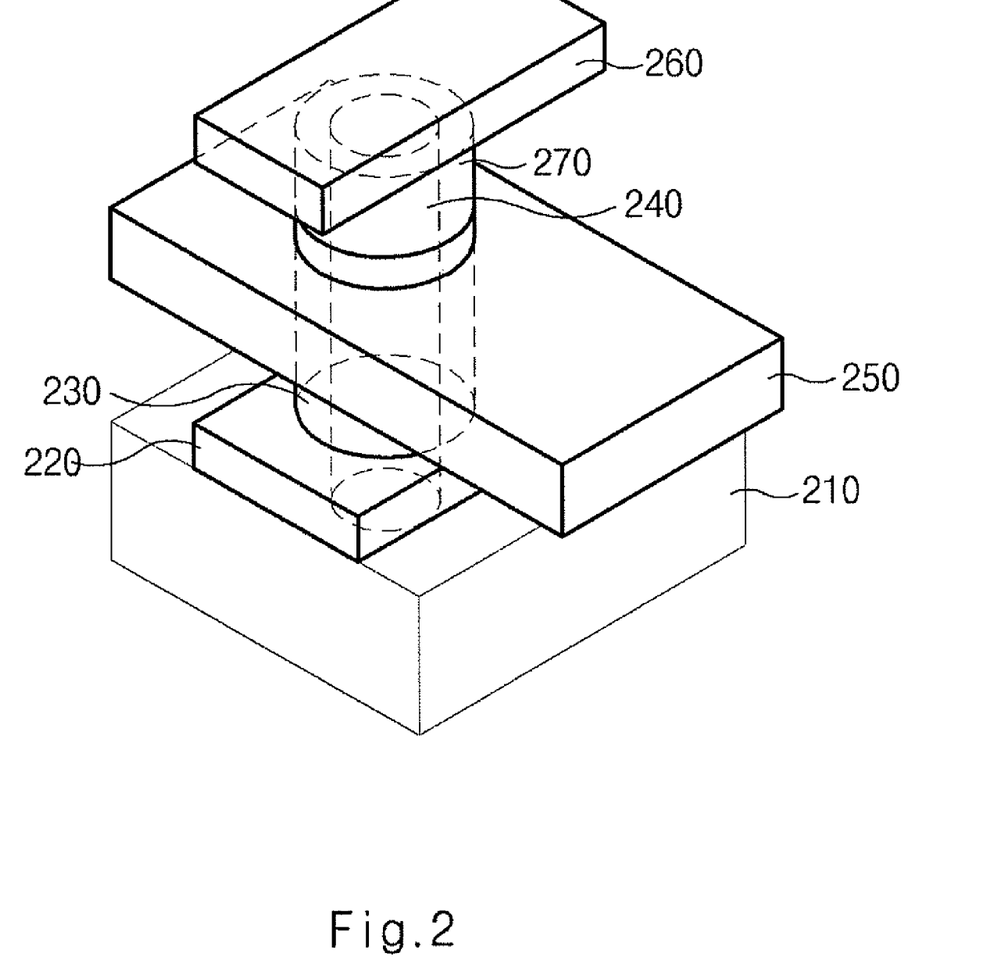
FIG. 2 is a perspective view illustrating a semiconductor device according to an embodiment of the present invention.

FIG. 2 is a perspective view illustrating a semiconductor device according to an embodiment of the present invention. A semiconductor device includes a semiconductor substrate 210, a source line 220, a channel structure 230, a bias electrode 240, a word line 250, and a bit line 260. Source line 220 is extended toward one side over semiconductor substrate 210.

Channel structure 230 is formed over source line 220 to have a vertical tube structure. An insulating film (not shown)

is formed over the inside wall of channel structure 230 to have a silicon-on-insulator (SOI) structure. A gate insulating film (not shown) is formed over the outside wall of channel structure 230. Bias electrode 240 is formed in channel structure 230 including the insulating film so that bias electrode 240 is connected to the semiconductor substrate 210. Bias electrode 240 is applied with a bias voltage to trap carriers (e.g., holes or electrons) in channel structure 230, thereby increasing data retention time. Although channel structure 230 is formed to be circular, it is not limited to a circular structure.

Gate electrode 250 is formed over the outside of channel structure 230 including the gate insulating film, to have a surrounding gate structure. Gate electrode 250 extends toward one side so that gate electrode 250 intersects source line 220. A line-width of gate electrode 250 is larger than the outer line width of channel structure 230 so as to cover channel structure 230. Bit line 260 is formed over channel structure 230 in parallel with source line 220. A bit line contact plug 270 may be further formed between bit line 260 and channel structure 230 so that the bit line 260 is connected to channel structure 230.

Figure 3A:
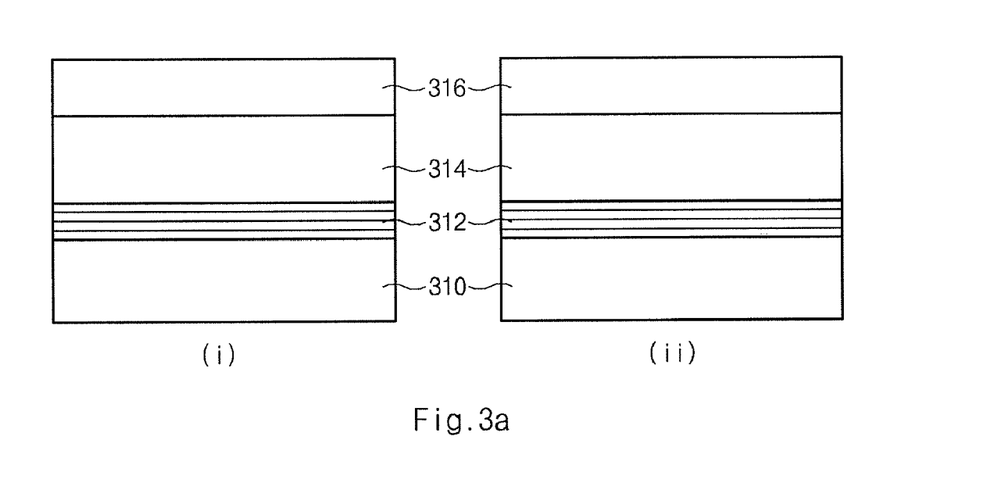
FIGS. 3a to 3s are cross-sectional views illustrating a method for fabricating a semiconductor device according to an embodiment of the present invention.
Figure 3B:
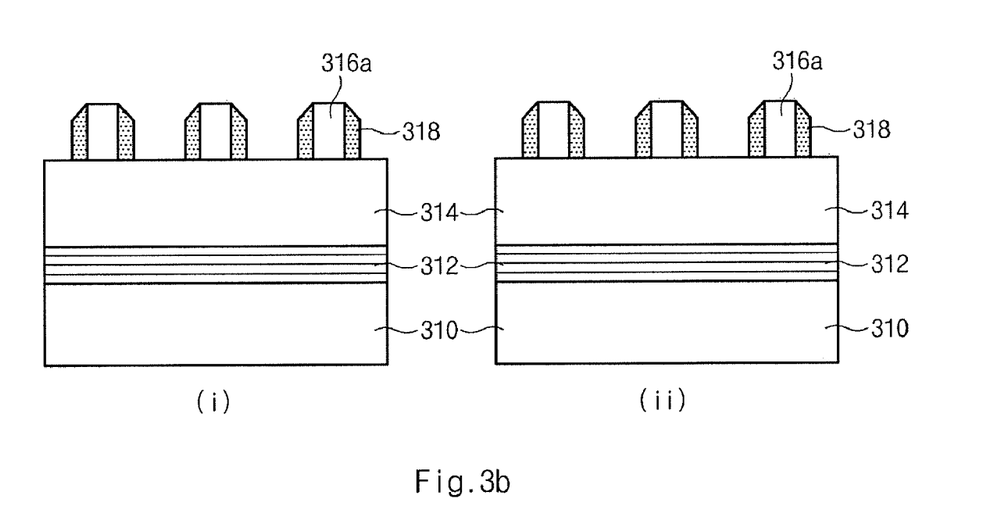
Figure 3C:
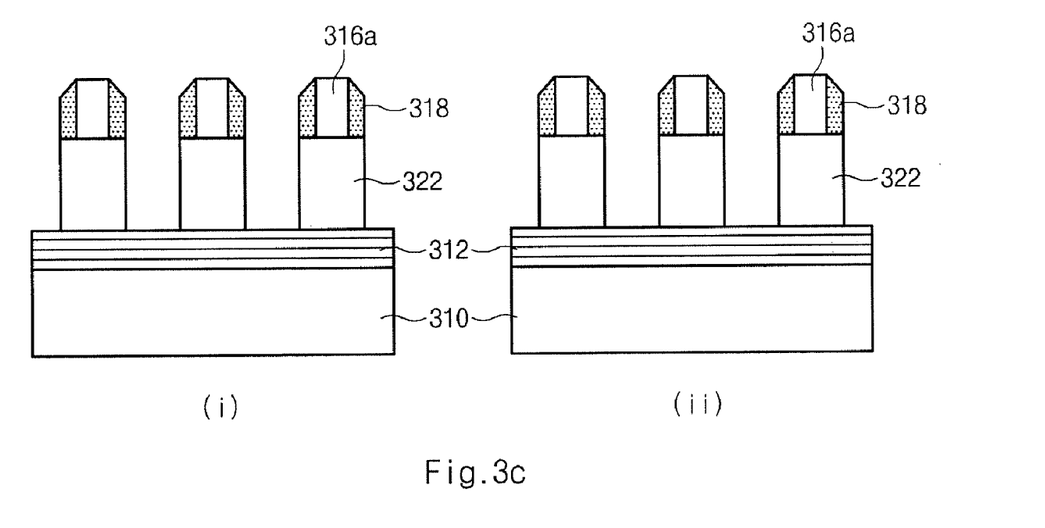
Figure 3D:
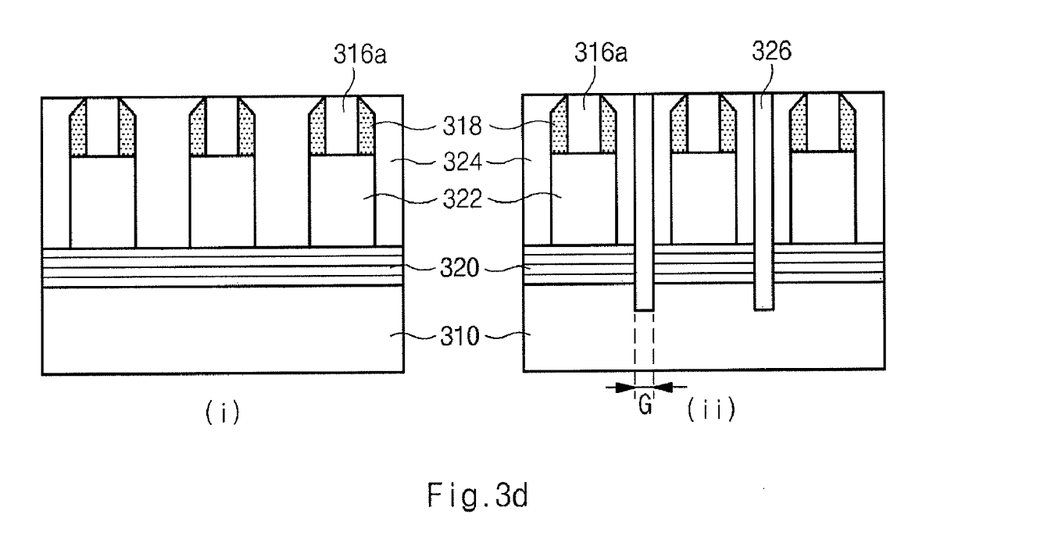
Figure 3E:
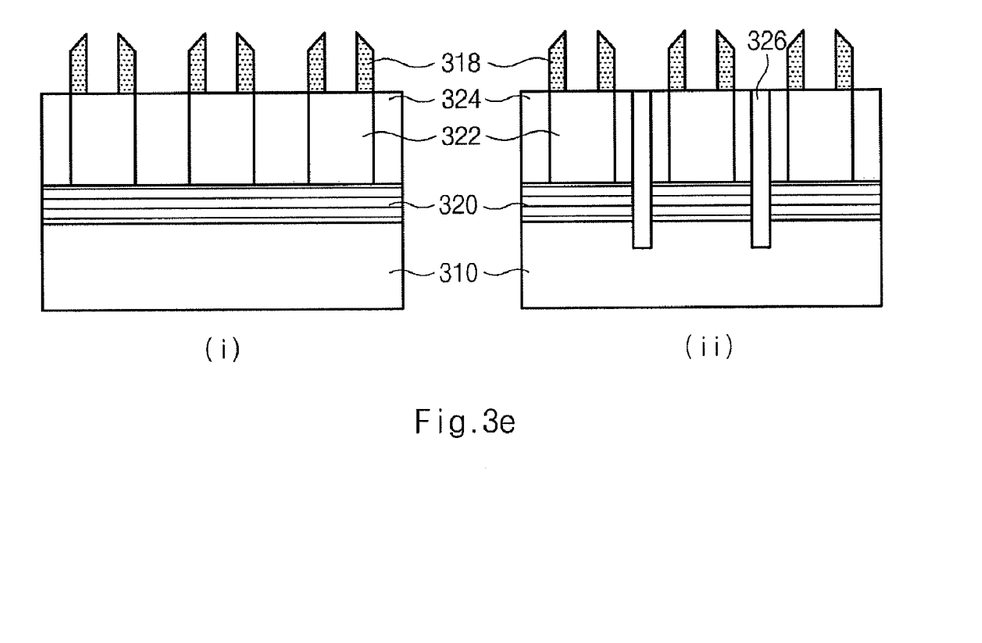
Figure 3F:
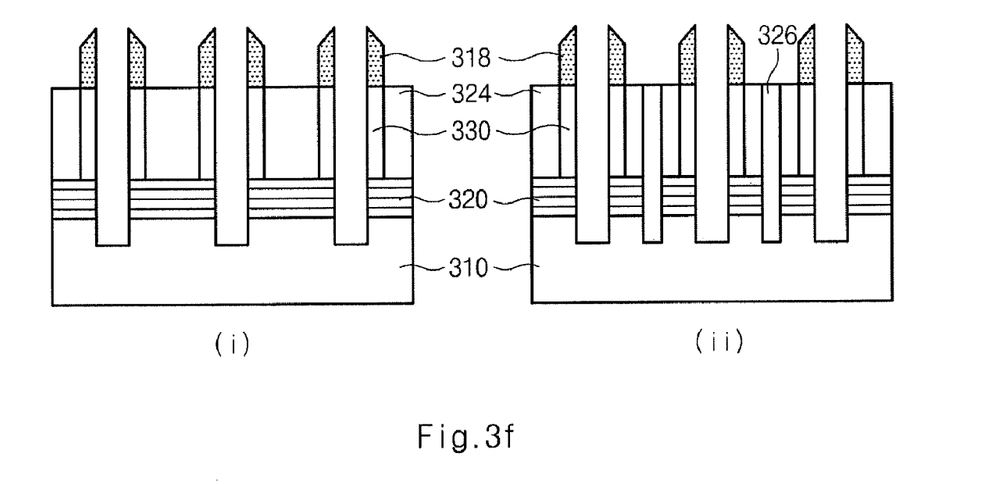
Figure 3G:
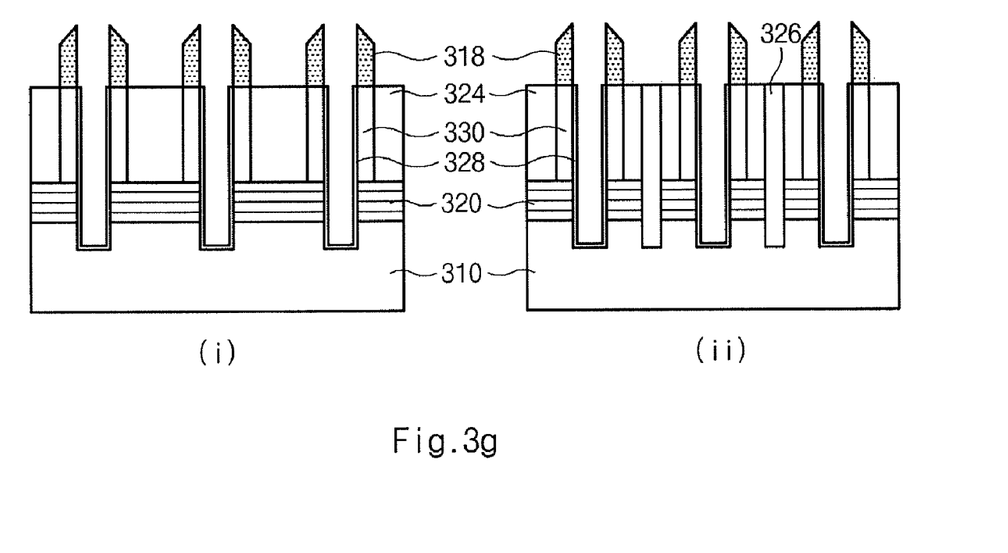
Figure 3H:
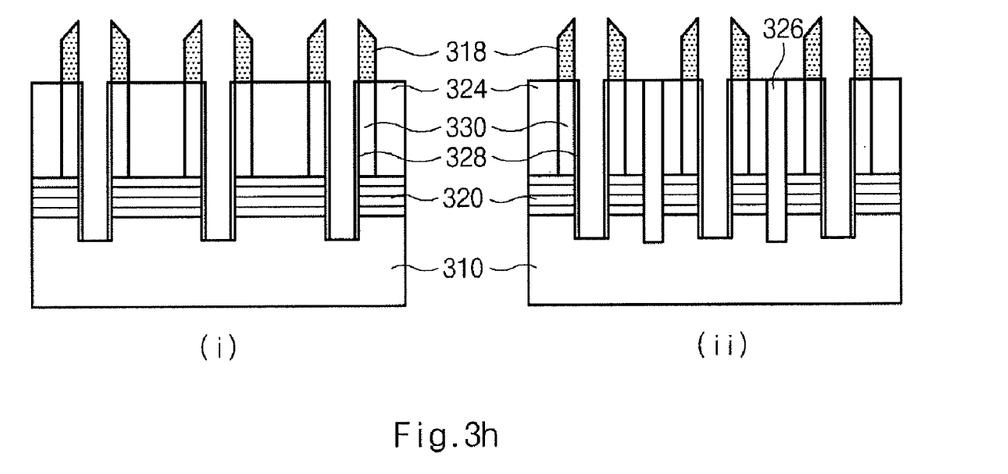
Figure 3I:
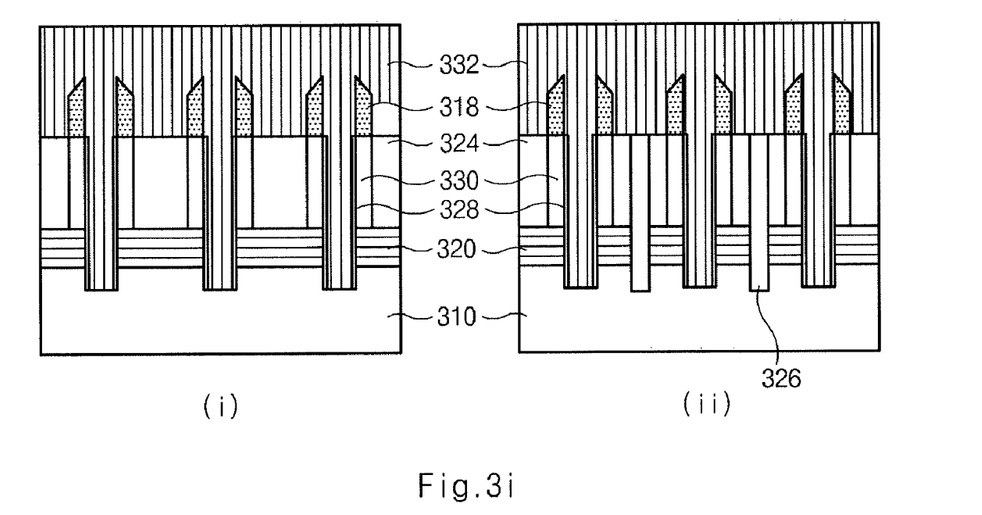
Figure 3J:
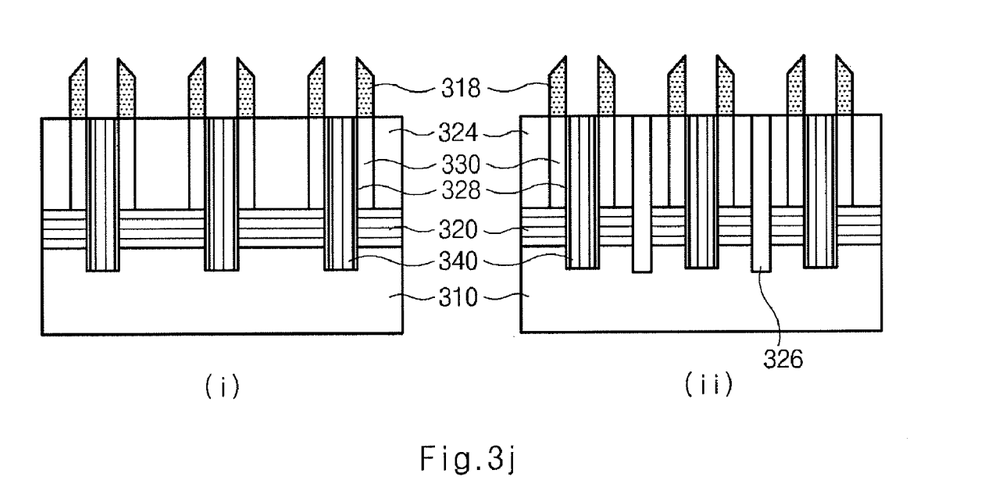
Figure 3K:
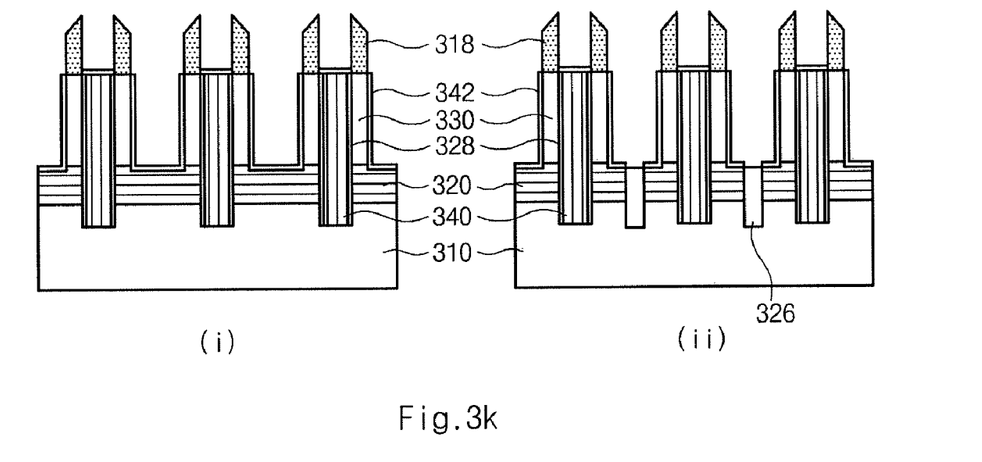
Figure 3L:
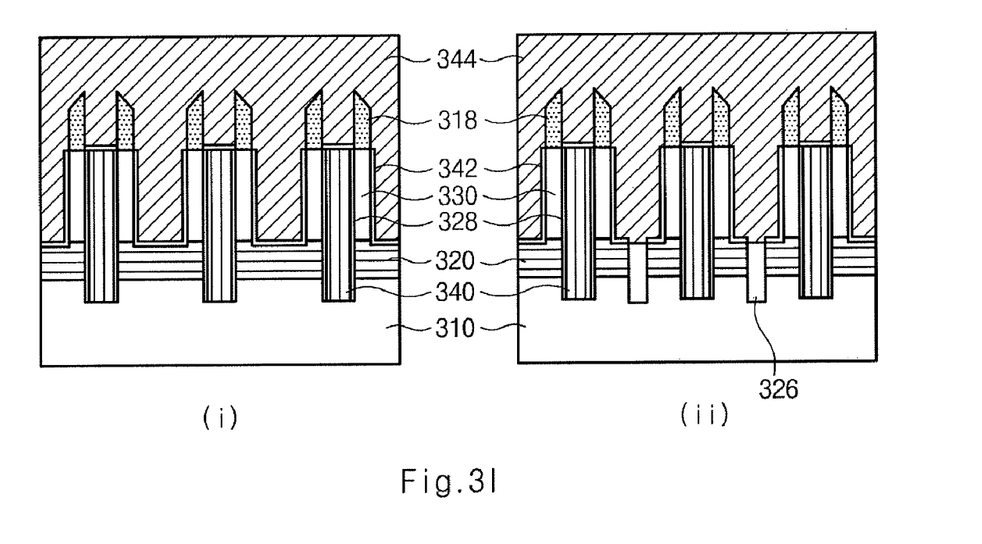
Figure 3M:
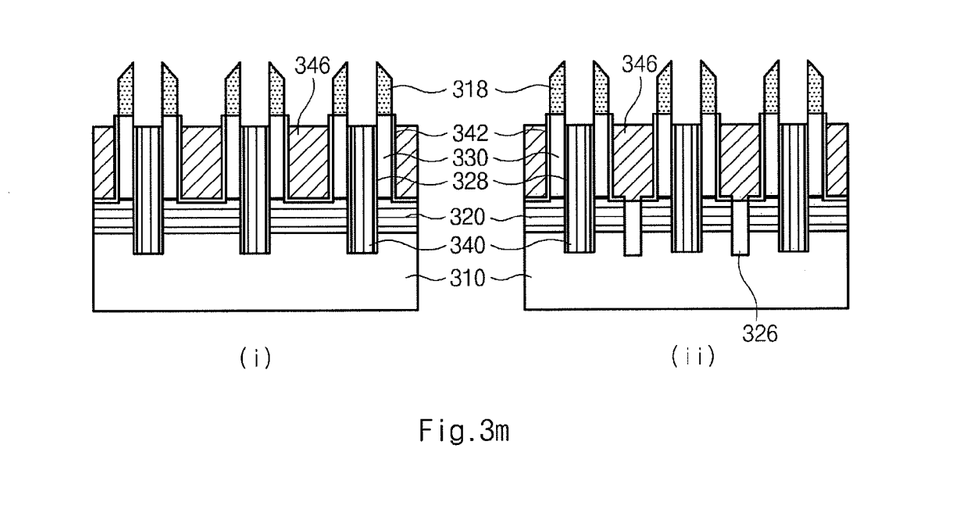
Figure 3N:
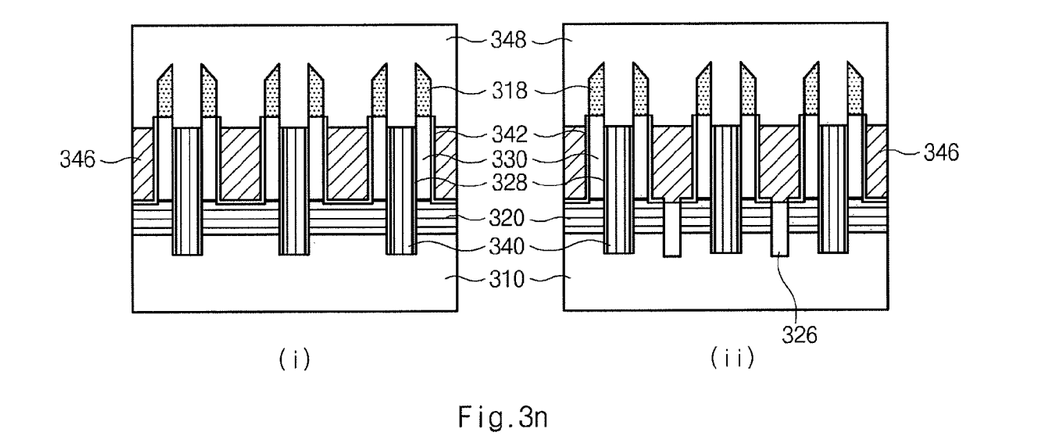
Figure 3O:
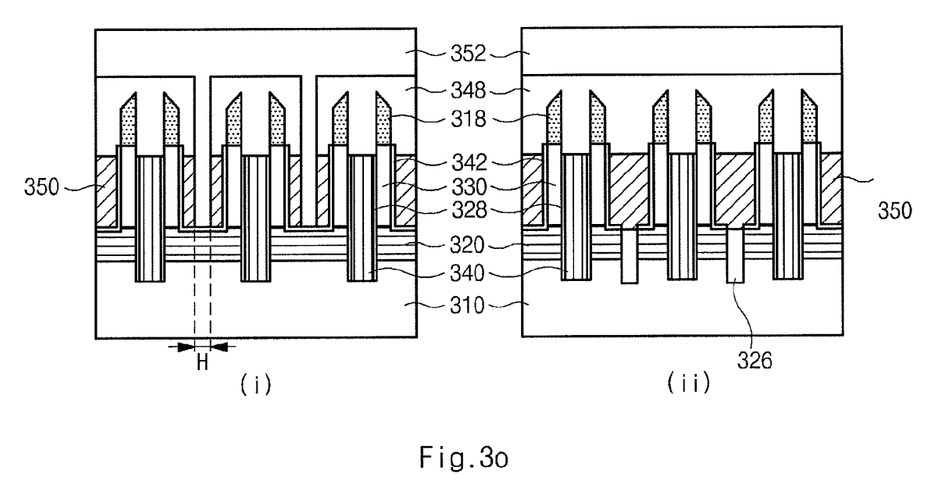
Figure 3P:
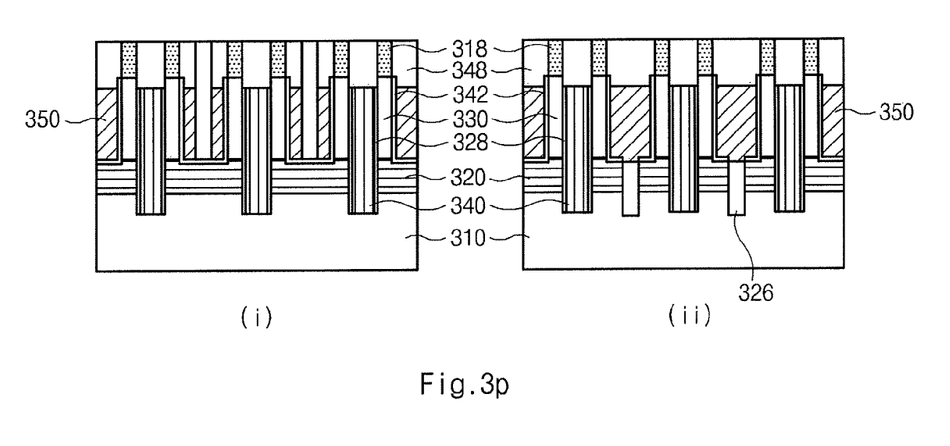
Figure 3Q:
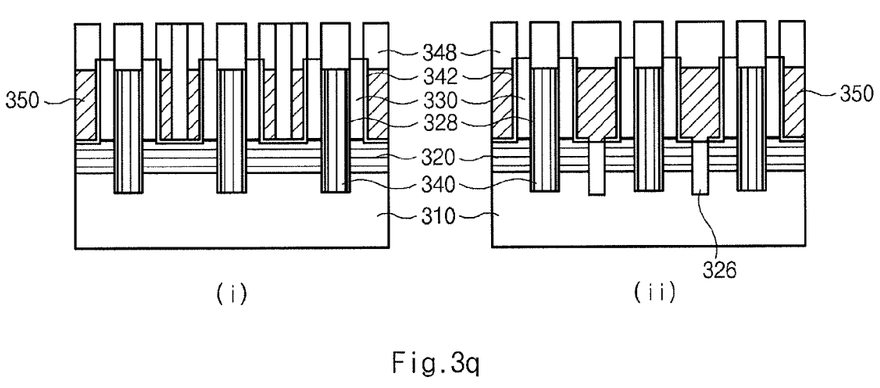
Figure 3R:
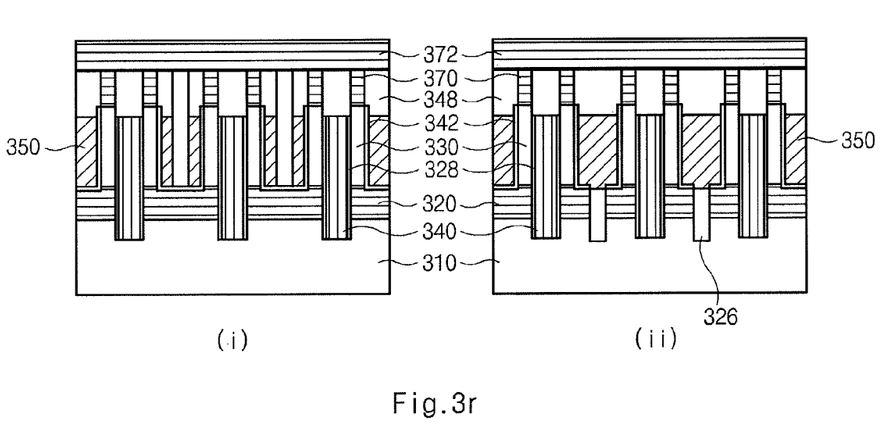
Figure 3S:
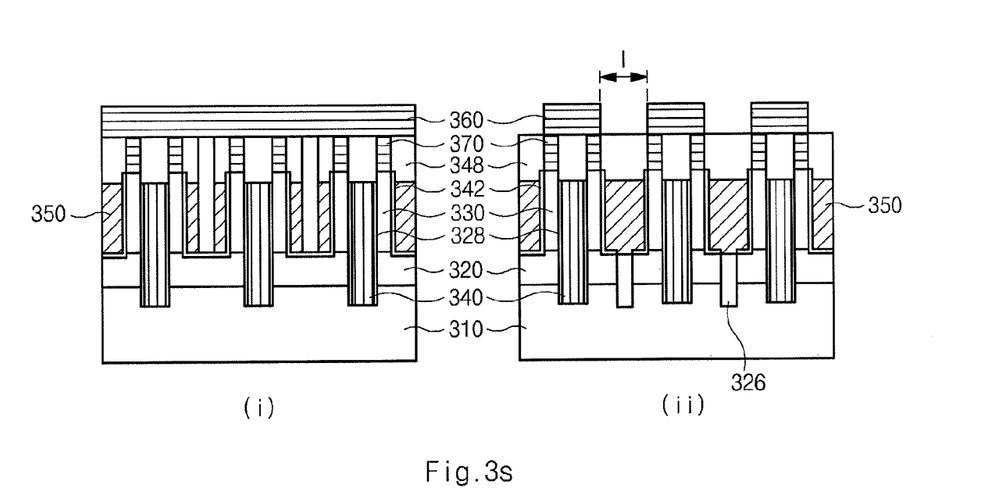

FIGS. 3a to 3s are cross-sectional views illustrating a method for fabricating a semiconductor device according to an embodiment of the present invention. FIGS. 3a(i) to 3s(i) are cross-sectional views taken along I-I' of FIG. 1, and FIGS. 3a(ii) to 3s(ii) are cross-sectional views taken along II-II' of FIG. 1. A cleaning process is performed on a semiconductor substrate 310 to remove a residual oxide film. A first silicon layer 312 doped with first-type impurities is formed over semiconductor substrate 310. A second silicon layer 314 doped with second-type impurities is formed over first silicon layer 312. A first hard mask layer 316 is formed over second silicon layer 314.

First silicon layer 312 includes a single crystal silicon layer. The single crystal silicon layer may be formed using a source gas including $SiCl_4/SiH_4$ and $SiH_2Cl_2$ and an additional gas including HCl and $H_2$, under a temperature in a range of about 400° C. to 1,000° C. and a pressure in a range of about 1 mTorr to 760 mTorr. First silicon layer 312 may have a thickness in a range of about 100 Å to 5,000 Å. First silicon layer 312 may be formed of an n-type silicon layer. The n-type silicon layer may be formed by implanting $PH_3$ into the single crystal layer or implanting $PH_3$ while the single crystal layer is formed. First silicon layer 312 may be formed by implanting first type impurity ions into semiconductor substrate 310. The first type impurity includes phosphorus (P) with a concentration in a range of about 1E18 ion/$cm^3$ to 1E21 ion/$cm^3$.

Second silicon layer 314 includes an undoped single crystal layer. The undoped single crystal layer may be formed using a source gas including $SiCl_4/SiH_4$ and $SiH_2Cl_2$ and an additional gas including HCl and $H_2$, under a temperature in a range of about 400° C. to 1,000° C. and a pressure in a range of about 1 mTorr to 760 mTorr. The second type impurity may be a p-type impurity including boron (B). Second silicon layer 314 doped with p-type impurities may be formed by implanting p-type impurities while the undoped single crystal layer is formed. In order to use second silicon layer 314 as a channel, the p-type impurities may be implanted into the undoped single crystal layer. Second silicon layer 314 may have a concentration of the second type impurity in a range of about 1E17 ion/$cm^3$ to 1E19 ion/$cm^3$. In one embodiment of the present invention, a vertical channel structure may be formed of second silicon layer 314, a metal layer, and a combination thereof. The vertical channel structure may include a titanium nitride (TiN) film, a tantalum nitride (TaN) film and a tungsten (W) layer.

First hard mask layer 316 may be an oxide film, a nitride film or a combination thereof. The oxide film may be formed using a source gas including $TEOS(Si(OC_2H_5)_4)$ and $SiH_4$ by a plasma CVD method. The nitride film may be formed using a source gas including $SiH_2Cl_2$ and $NH_3$ by a LPCVD method. First hard mask layer 316 has a thickness in a range of about 500 Å to 5,000 Å. The etching selectivity of first hard mask layer 316 is larger than that of a silicon layer. For example, the etching rate of first hard mask layer 316 may be a half or less of a silicon layer.

Referring to FIG. 3b, first hard mask layer 316 is etched using a mask that defines channel region 102 of FIG. 1 to form a first hard mask pattern (not shown). The first hard mask pattern is isotropic-etched to form a second hard mask pattern 316a, which reduces the size of the first hard mask pattern. A second hard mask pattern (not shown) is formed over second silicon layer 314 and second hard mask pattern 316a. The second hard mask layer is selectively etched to form a first spacer 318 over a sidewall of second hard mask pattern 316a. In one embodiment of the present invention, the mask that defines channel region 102 of FIG. 1 is rectangular having a width F that is a distance between the adjacent channel structures. Although active region 102 is formed to be rectangular (as shown in FIG. 1), active region 102 may be formed to be circular or polygonal.

The second hard mask layer is formed of a silicon nitride film using a source gas including $SiH_2Cl_2$ and $NH_3$ by a LPCVD method. First spacer 318 has a thickness in a range of about 100 Å to 500 Å. The etching selectivity of the second hard mask layer is larger than that of a silicon layer. For example, the etching rate of the second hard mask layer may be a half or less of a silicon layer. Also, the etching selectivity of the second hard mask layer is larger than that of the first hard mask layer. The etching rate of the second hard mask layer may be a half or less of the first hard mask layer.

Referring to FIGS. 3c and 3d, second silicon layer 314 of FIG. 3b is etched using first spacer 318 and second hard mask pattern 316a as an etching mask to form a silicon pillar 322. A first insulating film 324 is formed over first silicon layer 312, silicon pillar 322, first spacer 318 and second hard mask pattern 316a to fill silicon pillar 322. First insulating film 324 is planarized until second hard mask pattern 316a is exposed. First insulating film 324, first silicon layer 312 and a portion of semiconductor substrate 310 are etched using a mask that defines source line region 106 of FIG. 1 to form a first silicon pattern 320 for a source line. A second insulating film 326 is formed over semiconductor substrate 310, first silicon pattern 320 and first insulting film 324 to electrically separate first silicon pattern 320.

First insulating film 324 may include a silicon oxide film. First silicon pattern 320 may be formed with a line-type profile. The etching process for forming the first silicon pattern 320 may be performed by a spacer patterning technology (SPT). For example, a pitch, which is defined by a line-width of a pattern and a space defined between two adjacent patterns, may be twice or more of the minimum line-width. However, the space may be smaller than the minimum line-width. In this case, the pattern is formed to have the minimum line-width. A spacer is formed at a sidewall of the pattern to define a space smaller than the minimum line-width. The space that is smaller than the minimum line-width can be etched. In the present invention, although a process of etching a space smaller than a minimum line-width is performed by the SPT method, it is not so limited.

A distance between first silicon patterns 320 is G (0.5F <G<0.7F and F is a minimum line-width). The process of planarizing first insulating film 324 may be performed by a CMP method or an etch-back method. Second insulating film 326 includes a silicon oxide film. The silicon oxide film may be formed by a CVD method or an ALD method.

Referring to FIGS. 3e to 3h, second hard mask pattern 316a is removed to expose a top surface of silicon pillar 322. When second hard mask pattern 316a is removed, first insulating film 324 and second insulating film 326 may be etched to lower the height of first insulating film 324 and second insulating film 326. Silicon pillar 322, first silicon pattern 320, and a portion of semiconductor substrate 310 are etched to form a silicon tube 330 for a channel region. A third insulating film 328 is formed in silicon tube 330. Third insulating film 328 serves as a buried oxide film in a SOI structure. Third insulating film 328 is selectively etched to expose semiconductor substrate 310 at the bottom of silicon tube 330.

The process of removing second hard mask pattern 316a may be performed by a wet etching method including HF. Second hard mask pattern 316 may be removed by an etching method having an etching selectivity over first spacer 318. The etching method may be performed by a direct or remote plasma etching method including CHF, $O_2$, HCl, Ar, He or combinations thereof. The ratio of C, H and F in the CHF can be properly selected.

Third insulating film 328 includes silicon oxide film. The silicon oxide film may be formed under an atmosphere of $O_2$, $H_2O$, $H_2$, $O_3$ or combinations thereof at a temperature in a range of about 200° C. to 1000° C. Since variously crystallized silicon surfaces exist in silicon tube 330, third insulating film 328 may be formed by a radical silicon oxidation method to maintain a uniform thickness of third insulating film 328. Third insulating film 328 has a thickness in a range of about 1 nm to 100 nm. The process of selectively etching third insulating film 328 may be performed by a dry etching method.

Referring to FIGS. 3i to 3k, a first conductive layer 332 is formed over silicon tube 330, first insulating film 324, second insulating film 326, and first spacer 318 to fill silicon tube 330. First conductive layer 332 is selectively etched to form an isolated bias electrode 340. First insulating film 324 is selectively etched until first silicon pattern 320 is exposed, to expose an outside of silicon tube 330. A gate insulating film 342 is formed over first silicon pattern 320, silicon tube 330 and bias electrode 340.

A process of cleaning a surface of semiconductor substrate 310 is performed before first conductive layer 332 is formed so that bias electrode 340 is electrically connected to semiconductor substrate 310. First conductive layer 332 includes a polysilicon layer doped with p-type impurities. The p-type polysilicon layer may be formed using a CVD method by implanting p-type impurities while a polysilicon layer is formed. A plasma nitriding process may be further performed to prevent boron impurities from being diffused in first conductive layer 332. A silicon nitride film may be further formed over first conductive layer 332. The process of selectively etching first conductive layer 332 may be performed by an etch-back method.

The process of selectively etching first insulating film 324 may be performed by a dry or wet etch-back method. Gate insulating film 342 includes a silicon oxide film. The silicon oxide film may be formed under an atmosphere of $O_2$, $H_2O$, $H_2$, $O_3$ or combinations thereof at a temperature in a range of about 200° C. to 1,000° C. Since variously crystallized silicon surfaces exist in silicon tube 330, gate insulating film 342 may be formed by a radical silicon oxidation method to maintain a uniform thickness of gate insulating film 342. Gate insulating film 342 has a thickness in a range of about 1 nm to 100 nm.

Gate insulating film 342 may be nitrified using a plasma method after gate insulating film 342 is formed.

Gate insulating film 342 may be a silicon oxide film, a hafnium oxide film, an aluminum oxide film, a zirconium oxide film, a hafnium silicon nitride oxide film, a silicon nitride film or combinations thereof. Gate insulating film 342 has a thickness in a range of about 1 nm to 100 nm.

Referring to FIGS. 3l to 3n, a second conductive layer 344 is formed over gate insulating film 342, second insulating film 326 and first spacer 318 to fill a space defined between silicon tubes 330. Second conductive layer 344 is selectively etched to form a surrounding gate electrode 346 over an outside of silicon tube 330. A fourth insulating film 348 is formed over surrounding gate electrode 346 and first spacer 318 to fill surrounding gate electrode 346, bias electrode 340 and first spacer 318.

Second conductive layer 344 includes a stacked structure having a lower conductive layer (not shown) and an upper conductive layer (not shown). The lower conductive layer includes a polysilicon layer doped with impurities. The impurity doped polysilicon layer may be formed by a CVD method. The impurities including phosphorus (P) or boron (B) may be implanted while the polysilicon layer is formed. The upper conductive layer may be a tungsten (W) layer, an aluminum (Al) layer, a copper (Cu) layer, a tungsten silicide ($WSi_x$) layer or combinations thereof.

The process of selectively etching second conductive layer 344 may be performed by an etch-back method. A cleaning process including a wet etch method may be further performed so that second conductive layer 344 does not remain over the sidewall of first spacer 318. The top surface of gate electrode 346 may be formed to be lower than that of silicon tube 330 in order to be electrically separated from bias electrode 340. Fourth insulating film 348 includes a silicon oxide film.

Referring to FIGS. 3o and 3p, fourth insulating film 348 and gate electrode 346 are patterned using a mask that defines word line region 108 of FIG. 1, to form a word line 350 separated from gate electrode 346. A fifth insulating film 352 is formed over word line 350 and fourth insulating film 348. Fifth insulating film 352 and fourth insulating film 348 are selectively etched to expose first spacer 318.

Fifth insulating film 352 includes a silicon oxide film. The mask that defines word line region 108 of FIG. 1 is formed to have a line type. In one embodiment of the present invention, although the patterning process for forming the word line 350 is performed by a SPT etching method, it is not so limited. A distance between adjacent word lines is H ($0.5F<H<0.7F$). The process of selectively etching fourth insulating film 348 and fifth insulating film 352 may be performed by a CMP method.

Referring to FIGS. 3q to 3s, first spacer 318 is removed to expose the top surface of silicon tube 330. A third conductive layer (not shown) is formed over silicon tube 330 and fourth insulating film 348. Third conductive layer may be etched to expose fourth insulating film 348 to form a bit line contact plug 370. A fourth conductive layer 372 is formed over bit line contact plug 370 and fourth insulating film 348. Fourth conductive layer 372 is patterned using a mask that defines the bit line region 110 of FIG. 1 to form a bit line 360. Although the cell area of 4F2 can be obtained in the semiconductor device according to one embodiment of the present invention, it is not so limited.

The process of removing first spacer 318 may be performed by a wet etch method including a phosphoric acid. A cleaning process may be further performed using HF on silicon tube 330. The third conductive layer and fourth conductive layer 372 may be a n+ polysilicon layer, a titanium nitride (TiN) film, a tungsten (W) layer, an aluminum (Al) layer, a copper (Cu) layer or combinations thereof. After a polysilicon layer is filled in a space where first spacer 318 is removed, fourth conductive layer 372 is formed over the polysilicon layer and the fourth insulating film to lower an interface resistance. The mask that defines the bit line region is formed to have a line type. A distance between adjacent bit lines 360 is I (0.9F<I<1.1F).

FIGS. 4a to 4d are cross-sectional views illustrating a method for fabricating a semiconductor device according to an embodiment of the present invention. After a sidewall spacer is formed over a silicon pillar, the silicon pillar is etched with a mask to form a silicon tube. A trimming process may be not performed on a first hard mask pattern.

Referring to 4a to 4d, a second silicon layer is patterned using a first hard mask pattern 416 to form a silicon pillar 422. A sixth insulating film 424 is formed over a first silicon layer 412, silicon pillar 422 and a first hard mask pattern 416, to fill silicon pillar 422. Sixth insulating film 424 is planarized until first hard mask pattern 416 is exposed. Sixth insulating film 424, first silicon layer 412 and a portion of a semiconductor substrate 410 are etched using a mask that defines source line region 106 of FIG. 1, to form a first silicon pattern 420 for a source line. A seventh insulating film 426 is formed over first silicon pattern 420 and sixth insulating film 424, to electrically separate first silicon pattern 420.

Figure 4A:
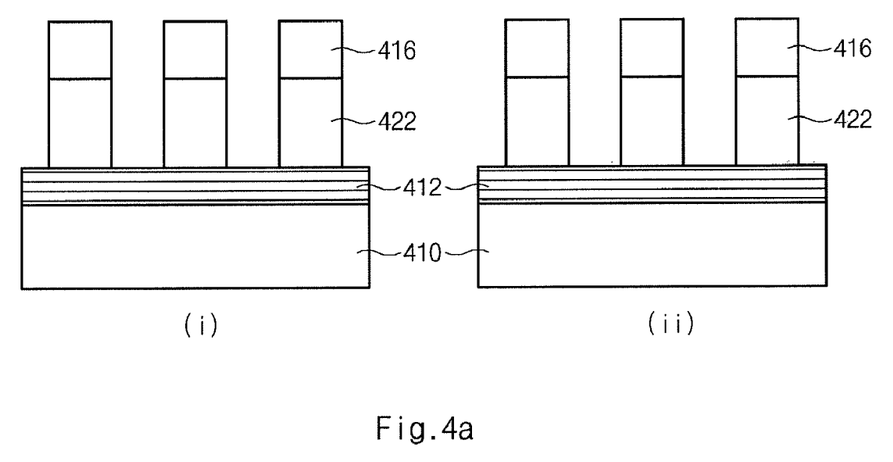
FIGS. 4a to 4d are cross-sectional views illustrating a method for fabricating a semiconductor device according to another embodiment of the present invention.
Figure 4B:
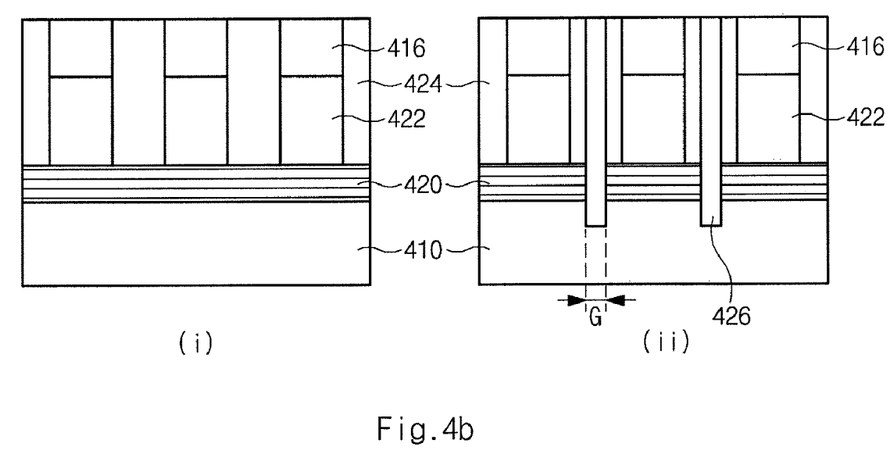

Sixth insulating film 424 includes a silicon oxide film. The process of planarizing sixth insulating film 424 may be performed by a CMP method. A mask that defines the source line region is formed to have a line type. Although the process of etching first silicon pattern 420 is performed by a SPT etching method, it is not so limited. A distance between first silicon patterns 420 is G (0.5F<G<0.7F). Seventh insulating film 426 includes a silicon oxide film. The silicon oxide film may be performed by a CVD method or an ALD method.

Figure 4C:
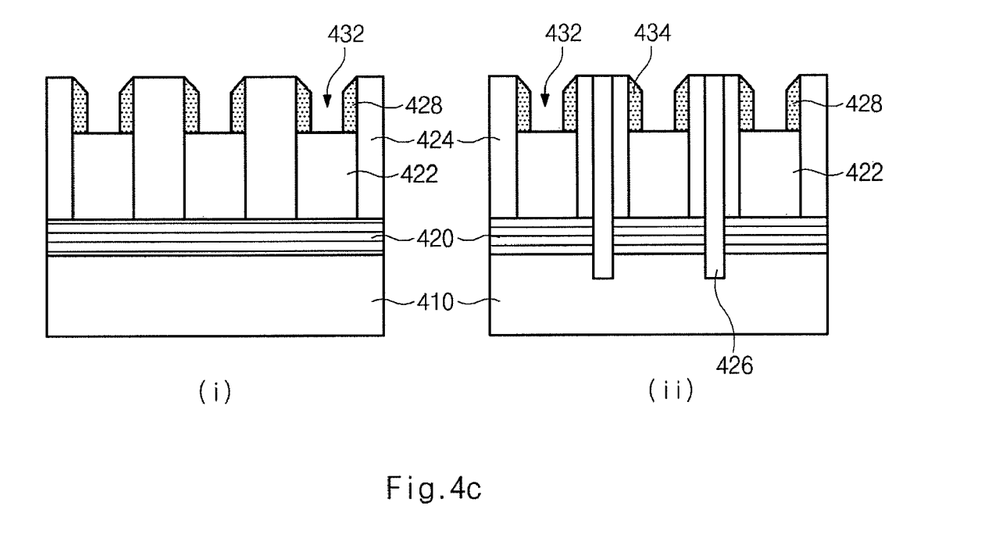
Figure 4D:
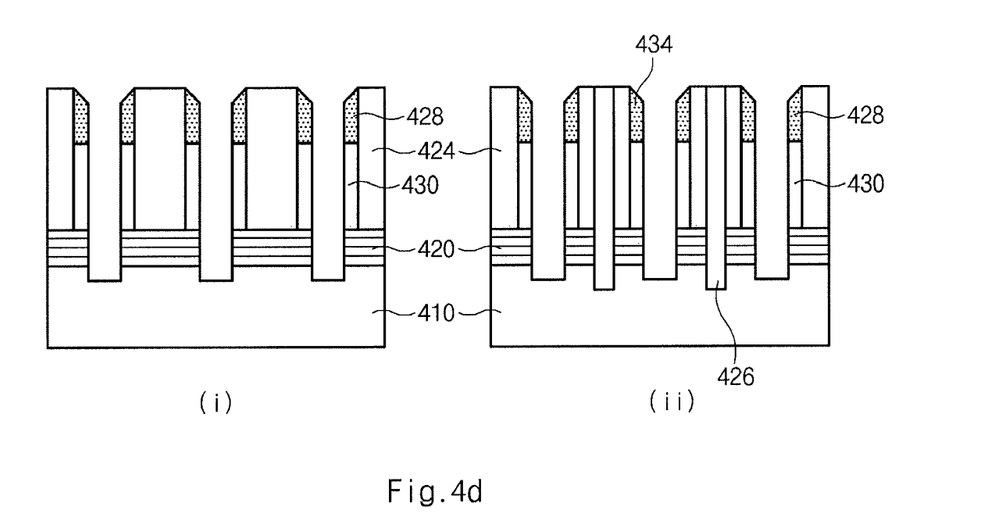

Referring to FIGS. 4c and 4d, first hard mask pattern 416 is removed to form a space 432 that exposes silicon pillar 422. A second spacer 434 is formed over a sidewall of space 432. Silicon pillar 422, first silicon pattern 420 and a portion of semiconductor substrate 410 are etched using second spacer 434 as an etching mask to form a silicon tube 430 for a channel region.

The process of removing first hard mask pattern 416 may be performed by a wet etch method. First hard mask pattern 416 formed of a silicon nitride film may be removed by a wet etch method including a phosphoric acid. An eighth insulating film (not shown) is formed over silicon pillar 422, sixth insulating film 424, and seventh insulating film 426, to form second spacer 434 over a sidewall of space 432. The eighth insulating film may be etched by a dry etch method to form a second spacer 428. The eighth insulating film includes a silicon nitride film. The silicon nitride film may be formed by a CVD method or an ALD method. The processes shown in FIGS. 3g to 3s may be performed to form a vertical floating body cell (FBC).

Data of the FBC can be stored as a potential in a silicon tube. When a high voltage is applied to a bit line to write the data as "1" state, an impact ionization occurs, and holes can be accumulated in a silicon tube. The potential in the silicon tube is changed into the "1" state. When a negative voltage is applied to the bit line to write the data as "0" state, holes are extracted from the silicon tube, and the potential in the silicon tube is changed into the "0" state.

As described above, according to an embodiment of the present invention, a vertical FBC can be obtained so as to secure a channel length even though the cell area is reduced.

Also, the FBC can be obtained without a SOI wafer to reduce costs. A chip includes a microprocessor and a memory with a logic circuit. Furthermore, the vertical FBC secures a sufficient area where charges can be accumulated, thereby improving data retention time. A bias electrode connected to a semiconductor substrate is formed in a channel to increase the data retention time. The outside of the channel is used as a channel region to secure a sufficient current, thereby efficiently generating charges and improving read/write operation speeds. A channel is isolated in each transistor, thereby inhibiting a change phenomenon of a threshold voltage depending on an adjacent channel potential. As a result, an excellent signal-to-noise rate can be obtained.

The above embodiments of the present invention are illustrative and not limitative. Various alternatives and equivalents are possible. The invention is not limited by the lithography steps described herein. Nor is the invention limited to any specific type of semiconductor device. For example, the present invention may be implemented in a dynamic random access memory (DRAM) device or a non-volatile memory device. Other additions, subtractions, or modifications are obvious in view of the present disclosure and are intended to fall within the scope of the appended claims.

What is claimed is:

1. A method for fabricating a semiconductor device, the method comprising:
    forming a conductive pillar over a semiconductor substrate;
    etching a portion of the conductive pillar and the semiconductor substrate to form a conductive tube;
    forming an insulating film over an inner sidewall of the conductive tube;
    forming a bias electrode connected to the semiconductor substrate to fill the conductive tube;
    forming a gate insulating film over an outer surface of the conductive tube; and
    forming a surrounding gate electrode over the gate insulating film.

2. The method according to claim 1, wherein the forming-a-conductive-pillar step includes:
    forming a conductive layer over the semiconductor substrate;
    forming a hard mask layer over the conductive layer;
    selectively etching the hard mask layer with an active region mask to form a hard mask pattern;
    forming a spacer over a sidewall of the hard mask pattern; and
    selectively etching the conductive layer using the hard mask pattern and the spacer as an etching mask to form the conductive pillar.

3. The method according to claim 2, wherein the conductive layer is formed of a p-type or undoped silicon layer to have a thickness in a range of about 500 Å to 5,000 Å.

4. The method according to claim 2, wherein the conductive layer is implanted with boron (B).

5. The method according to claim 2, wherein the hard mask layer is selected from the group consisting of an oxide film, a silicon nitride film and a combination thereof to have a thickness in a range of about 500 Å to 5,000 Å.

6. The method according to claim 2, wherein the spacer is formed of a silicon nitride film to have a thickness in a range of about 100 Å to 500 Å.

7. The method according to claim 2, wherein a shape of the active region mask is circular or polygonal.

8. The method according to claim 2, wherein the insulating film is formed of a silicon oxide film to have a thickness in a range of about 1 nm to 100 nm.

9. The method according to claim 1, wherein the bias electrode is selected from the group consisting of a single crystal silicon layer, a polysilicon layer, a titanium nitride (TiN) film, a tantalum nitride (TaN) film, a tungsten (W) layer and combinations thereof.

10. The method according to claim 1, wherein the gate insulating film is selected from the group consisting of a silicon oxide film, a hafnium oxide film, an aluminum oxide film, a zirconium oxide film, a hafnium silicon oxynitride film, a silicon nitride film and combinations thereof to have a thickness in a range of about 1 nm to 100 nm.

11. The method according to claim 1, wherein the gate electrode is selected from the group consisting of a polysilicon layer, a titanium (Ti) layer, a titanium nitride (TiN) film, a tantalum nitride (TaN) film, a tungsten (W) layer, an aluminum (Al) layer, a copper (Cu) layer, a tungsten silicide ($WSi_x$) layer and combinations thereof.

12. The method according to claim 1, further comprising forming a second conductive line connected to a top of the conductive tube.

13. The method according to claim 1, further comprising forming a first conductive line between the semiconductor substrate and the conductive tube.

14. The method according to claim 13, wherein the first conductive line is formed of a single crystal silicon layer by a silicon growth method to have a thickness in a range of about 100 Å to 5,000 Å.

15. The method according to claim 13, wherein the first conductive line is implanted with $PH_3$.

16. A method for fabricating a semiconductor device, the method comprising:
   forming a conductive layer over the semiconductor substrate;
   forming a hard mask layer over the conductive layer;
   selectively etching the hard mask layer to form a hard mask pattern;
   forming a spacer over a sidewall of the hard mask pattern;
   selectively etching the conductive layer using the hard mask pattern and the spacer as an etching mask to form a conductive pillar;
   etching a portion of the conductive pillar and the semiconductor substrate to form a conductive tube, wherein a first conductive line is formed between the semiconductor substrate and the conductive tube;
   forming an insulating film over an inner sidewall of the conductive tube;
   forming a bias electrode connected to the semiconductor substrate to fill the conductive tube;
   forming a gate insulating film over an outer sidewall of the conductive tube; and
   forming a surrounding gate electrode over the gate insulating film.

17. The method according to claim 16, further comprising forming a second conductive line connected to a top of the conductive tube.

* * * * *